United States Patent
Nguyen et al.

(10) Patent No.: US 10,153,786 B1
(45) Date of Patent: Dec. 11, 2018

(54) ITERATIVE DECODER WITH DYNAMICALLY-VARIABLE PERFORMANCE

(71) Applicant: Marvell International Ltd., Hamilton (BM)

(72) Inventors: Phong Sy Nguyen, Ho Chi Minh (VN); Shashi Kiran Chilappagari, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 6 days.

(21) Appl. No.: 15/012,066

(22) Filed: Feb. 1, 2016

Related U.S. Application Data

(60) Provisional application No. 62/112,818, filed on Feb. 6, 2015.

(51) Int. Cl.
*H03M 13/37* (2006.01)

(52) U.S. Cl.
CPC ... *H03M 13/3753* (2013.01); *H03M 13/3738* (2013.01)

(58) Field of Classification Search
CPC ......... H03M 13/3753; H03M 13/3738; H03M 13/1108; H03M 13/1111; H03M 13/3707; H03M 13/611; H03M 13/1191; H03M 13/1515; H03M 13/152; H03M 13/2957; G06F 11/0727; G06F 11/076; G06F 11/1012

See application file for complete search history.

(56) References Cited

U.S. PATENT DOCUMENTS

| | | | |
|---|---|---|---|
| 8,312,354 B1 * | 11/2012 | Varnica | H03M 13/1105 714/780 |
| 8,429,498 B1 * | 4/2013 | Anholt | G06F 11/1048 365/227 |
| 9,214,963 B1 * | 12/2015 | Garani | H03M 13/1102 |
| 9,564,931 B1 * | 2/2017 | Nguyen | H03M 13/3707 |
| 2006/0192691 A1 * | 8/2006 | Kan | H03M 13/1191 341/50 |
| 2009/0249160 A1 * | 10/2009 | Gao | H03M 13/1105 714/752 |
| 2012/0137152 A1 * | 5/2012 | Dror | G06F 11/1048 713/322 |
| 2015/0188570 A1 * | 7/2015 | Kwok | G06F 11/1076 714/764 |

(Continued)

*Primary Examiner* — Kyle Vallecillo

(57) ABSTRACT

A decoding method decodes data iteratively according to a first rule, measures at a selected iteration at least one performance criterion of the decoding of data according to the first rule, performs at the selected iteration a comparison of the at least one performance criterion to a threshold, when the comparison yields a first result relative to the threshold, continues decoding according to the first rule, and when the comparison yields a second result relative to the threshold, continues decoding according to a further rule. Decoding apparatus operates according to the method. The decoding according to the first rule, the measuring at least one performance criterion at the selected iteration, the performing the comparison at the selected iteration, and the continuing decoding according to the first or further rule, may be repeated until the comparison yields a predetermined result. Repeating may be stopped after a predetermined maximum number of iterations.

22 Claims, 6 Drawing Sheets

(56) References Cited

U.S. PATENT DOCUMENTS

| | | | | |
|---|---|---|---|---|
| 2015/0363247 | A1* | 12/2015 | Bisplinghoff | G06F 11/076 |
| | | | | 714/704 |
| 2015/0381206 | A1* | 12/2015 | Fainzilber | H03M 13/1108 |
| | | | | 714/758 |
| 2016/0179620 | A1* | 6/2016 | Bazarsky | H03M 13/116 |
| | | | | 714/766 |

* cited by examiner

ITERATIVE DECODER WITH DYNAMICALLY-VARIABLE PERFORMANCE

CROSS REFERENCE TO RELATED APPLICATION

This claims the benefit of commonly-assigned U.S. Provisional Patent Application No. 62/112,818, filed Feb. 6, 2015, which is hereby incorporated by reference herein in its entirety.

FIELD OF USE

Implementations of the subject matter of this disclosure generally pertain to apparatus and methods for processing streams of user data for applications including data recording and data communication. In particular, embodiments of the invention pertain to apparatus and methods, for decoding streams of data, having dynamically-variable performance characteristics.

BACKGROUND

The background description provided herein is for the purpose of generally presenting the context of the disclosure. Work of the inventor hereof, to the extent the work is described in this background section, as well as aspects of the description that may not otherwise qualify as prior art at the time of filing, are neither expressly nor impliedly admitted to be prior art against the present disclosure.

Iterative codes have found wide-spread application in areas such as magnetic recording and data communications. Such codes are often used with a detector (e.g., a Viterbi detector) to provide a degree of error correction when detecting and decoding received or recorded data. One example of an iterative code is a low-density parity-check (LDPC) code.

There exist a variety of techniques to decode iterative codes (such as LDPC codes). Different ones of those techniques may have different performance characteristics, such as complexity, power profile, hardware requirements, convergence profile (i.e., how many iterations are needed to converge on a decoded codeword), and reliability (i.e., how likely it is that a codeword will be successfully decoded). These performance characteristics are often conflicting. For example, it is desirable to have lower power consumption and smaller hardware size, while at the same time having better reliability and higher throughput. It may be difficult to achieve all of those goals using a single decoding technique. Instead, different decoding techniques (or variations of a specific technique) may be needed to achieve different ones of those goals. Moreover, different input data patterns may result in different performance for same technique or, put another way, achieving the same performance for different input data patterns may require use of different techniques.

SUMMARY

A decoding method according to an implementation of the subject matter of this disclosure includes decoding data iteratively according to a first rule, measuring at a selected iteration at least one performance criterion of the decoding of data according to the first rule, performing at the selected iteration a comparison of the at least one performance criterion to a threshold, when the comparison yields a first result relative to the threshold, continuing decoding according to the first rule, and when the comparison yields a second result relative to the threshold, changing to a further rule different from the first rule and continuing decoding according to the further rule.

Such a decoding method may further include repeating the decoding data according to the first rule, the measuring the at least one performance criterion at the selected iteration, the performing the comparison at the selected iteration, and the continuing decoding according to the first or further rule, until the comparison yields a predetermined result. The repeating may be stopped after a predetermined maximum number of iterations.

In one such decoding method, there may be only one further rule, and once the comparison results in decoding according to the further rule, the repeating continues but decoding is not performed according to the first rule during any iteration.

In another such decoding method, there may be a plurality of further rules of varying reliability and a plurality of thresholds, where during any selected iteration, the comparison is performed based on a threshold related to the rule according to which decoding is performed during that selected iteration, and once the comparison results in decoding according to one of the further rules having a certain reliability, the repeating continues but decoding during any iteration is not performed according to the first rule or any of the further rules that have already been used.

For any rule, the threshold related to that rule may be determined based on performance statistics for that rule, which may be syndrome weights or bit flips.

Apparatus according to an implementation of this subject matter of this disclosure, for decoding received encoded data, includes iterative decoding circuitry that operates selectably according to at least a first rule and a further rule, circuitry that measures at a selected iteration at least one performance criterion of the decoding circuitry of data according to the first rule, and circuitry that performs at the selected iteration a comparison of the at least one performance criterion to a threshold. When the comparison yields a first result relative to the threshold, the decoding circuitry continues to decode according to the first rule, and when the comparison yields a second result relative to the threshold, the decoding circuitry changes to a further rule different from the first rule and continues to decode according to the further rule.

According to implementations of the subject matter of this disclosure, in such apparatus, the decoding circuitry, the circuitry that measures at least one performance criterion at the selected iteration, and the circuitry that performs a comparison at the selected iteration, may operate iteratively until the comparison yields a predetermined result. Iterative operation may be stopped after a predetermined maximum number of iterations.

In one such apparatus, there may be only one further rule, and once the comparison results in the decoding circuitry changing to the further rule, iterative operation continues but the decoding circuitry does not operate according to the first rule during any iteration.

In another such apparatus, there may be a plurality of further rules of varying reliability and a plurality of thresholds, and during any selected iteration, the circuitry that performs the comparison performs the comparison based on a threshold related to the rule according to which the decoding circuitry operates during that one iteration, and once the comparison results in decoding circuitry changing to one of the further rules having a certain reliability, iterative operation continues but the decoding circuitry does not operate during any iteration according to the first rule or any of the further rules that have already been used.

For any rule, the threshold related to that rule may be determined based on performance statistics for that rule, which may be syndrome weights or bit flips.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
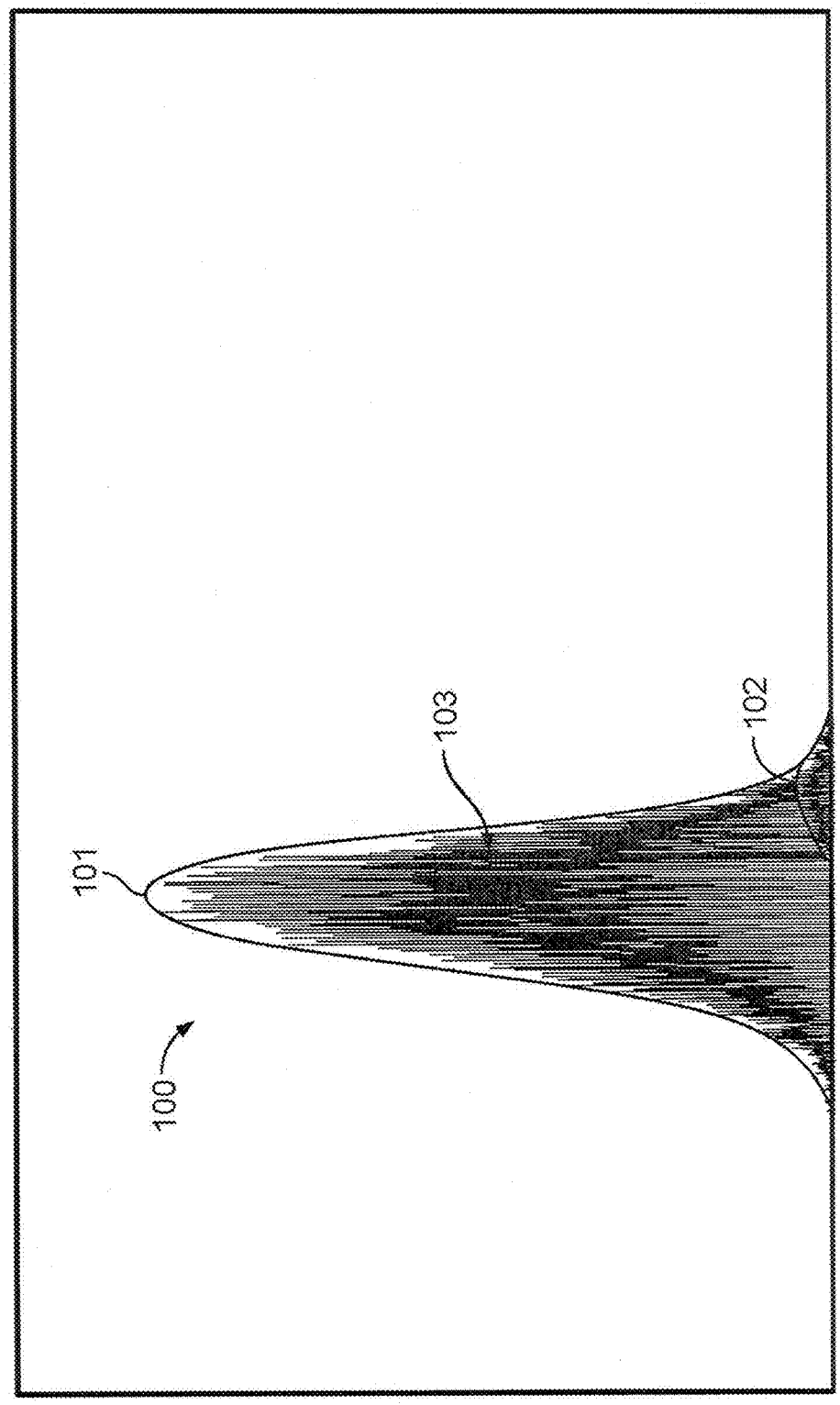
FIG. 1 shows a histogram of syndrome weights that may be used to develop a metric according to an implementation of the subject matter of this disclosure.

Known iterative decoders are static, operating according to a fixed rule or set of rules. Other known iterative decoders may use a set of rules that changes in a predetermined way; these also are considered to be static. An iterative decoder may operate in accordance with implementations of the subject matter of this disclosure to switch dynamically among different decoding rules according to one or more metrics derived during the decoding process. This allows the iterative decoder to vary decoding rules depending on the varying inputs to the iterative decoder.

As is known, for a linear block code C, there exists an m×n parity-check matrix H. If x is a row vector of length n, the vector $s=Hx^T$ of length m is called the syndrome of x. The number of non-zero values in the syndrome vector s is referred to as the syndrome weight of x. The vector x is a codeword of C if and only if the syndrome weight of x is zero.

For iterative decoding systems, such as LDPC decoders for LDPC codes, early convergence features can be added to improve throughput. One such early convergence feature involves checking the syndrome weight. If the syndrome weight after an iteration is zero, then the decoder can stop and output the decoded codeword. Otherwise, the decoder will keep running until a maximum number of iterations is reached.

Iterative decoders typically have controllable settings that may affect performance (i.e., how good or reliable the decoded result is), speed (measured, e.g., by the number of iterations required to decode a codeword), and power consumption. These factors may be in conflict. For example, to achieve the best possible performance, more iterations before convergence (i.e., slower operation) and more power may be required. Different combinations of settings may be provided as different "rules" that balance these factors differently.

In some implementations there may be a rule that achieves the best performance for a given number of iterations (recognizing that infinite iterations are impractical, and that most users set a maximum number of iterations). Such a rule may be referred to as "Rule O" (for "optimal"). There also may be another rule that may run faster (i.e., require fewer iterations before convergence) and/or use less power, but whose performance, while acceptable, may be less than optimal. Such a rule may be referred to as "Rule S" (for "speedy").

Implementations of the subject matter of this disclosure offer improved speed/convergence and power profiles for a given level of performance. This may be achieved in accordance with implementations of the subject matter of this disclosure by adaptively switching rules during operation, according to the values of certain metrics measured during operation, to achieve performance close to that of Rule O with speed/convergence and power profiles close to those of Rule S.

In a generalized implementation according to the subject matter of this disclosure offer, $R_1, R_2, \ldots, R_d$ may be a set of d "nested" decoding rules where rules $R_j$ and $R_{j+1}$ are the same up to iteration iter=$I_j$ and different only after iteration iter=$I_j$, where iter=1, 2, 3, . . . , and $I_1 < I_2 < \ldots < I_{d-1}$ may be a list of iteration numbers chosen from among all values of iter. $T_1, T_2, \ldots, T_{d-1}$ may be a list thresholds predefined for each code C.

According to this generalized implementation, decoding starts with the first decoding rule $R_1$. After iteration iter=$I_1$, the decoder will collect certain statistics and compare them with the threshold $T_1$ to determine whether to continue under rule $R_1$ or switch to rule $R_2$. This occurs at every one of the chosen iterations. At iteration iter=$I_j$, supposing that rule $R_j$ has been in operation, the decoder will collect statistics and compare with the threshold $T_j$ to determine whether to continue with rule $R_j$ or switch to rule $R_{j+1}$.

The decoding process may continue until the syndrome weight is zero or some maximum number of iterations is reached. The thresholds may be based on syndrome weights or some other metric. FIG. 1 illustrates one way that syndrome weights can be used to determine the thresholds.

FIG. 1 is a histogram 100 of syndrome weights for a particular one of the d rules after a particular iteration at a certain signal-to-noise ratio. The abscissa represents the syndrome weight while the ordinate represents the codeword count. The larger peak 101 represents the codewords corrected by the rule in question, while the smaller peak 102 represents the codewords not corrected by the rule in question. The syndrome weight 103 at which peak 102 begins may be set as the threshold at which the next, more optimal, rule should be selected.

In some implementations, the statistics to be compared after iteration iter, $I_j$ can be the syndrome weight, the number of bit flips in the hard decision, or some combination of those two statistics.

The number of nested rules d, the decoding rules $R_1, \ldots, R_d$, the iterations $I_1, \ldots, I_{d-1}$ at which comparing occurs, and the thresholds $T_1, \ldots, T_{d-1}$ can be configurable to offer flexible levels of trade-off in the decoding system. For example, at one extreme, one could choose always to use Rule O for maximum reliability, even though the power consumption would be high. At the other extreme, one could choose always to use Rule S for power savings, even though reliability might be lower. In most cases, the configuration would be somewhere in between.

Thus, in some implementations, the first rule $R_1$ and threshold $T_1$ can be chosen so that for the majority of time the rule $R_1$ would be used and can correct the majority of errors encountered. For example, if the chosen rule $R_1$ has a good convergence and/or power profile (e.g., the aforementioned Rule S), then the overall convergence/power profile would be dominated by the convergence/power profile of the rule $R_1$, because most of the input patterns would use rule $R_1$. The additional rules $R_2, \ldots, R_d$ can be chosen to further improve the convergence/power profile and to correct more of the errors that rule $R_1$ fails to correct, to improve overall performance.

Figure 2:
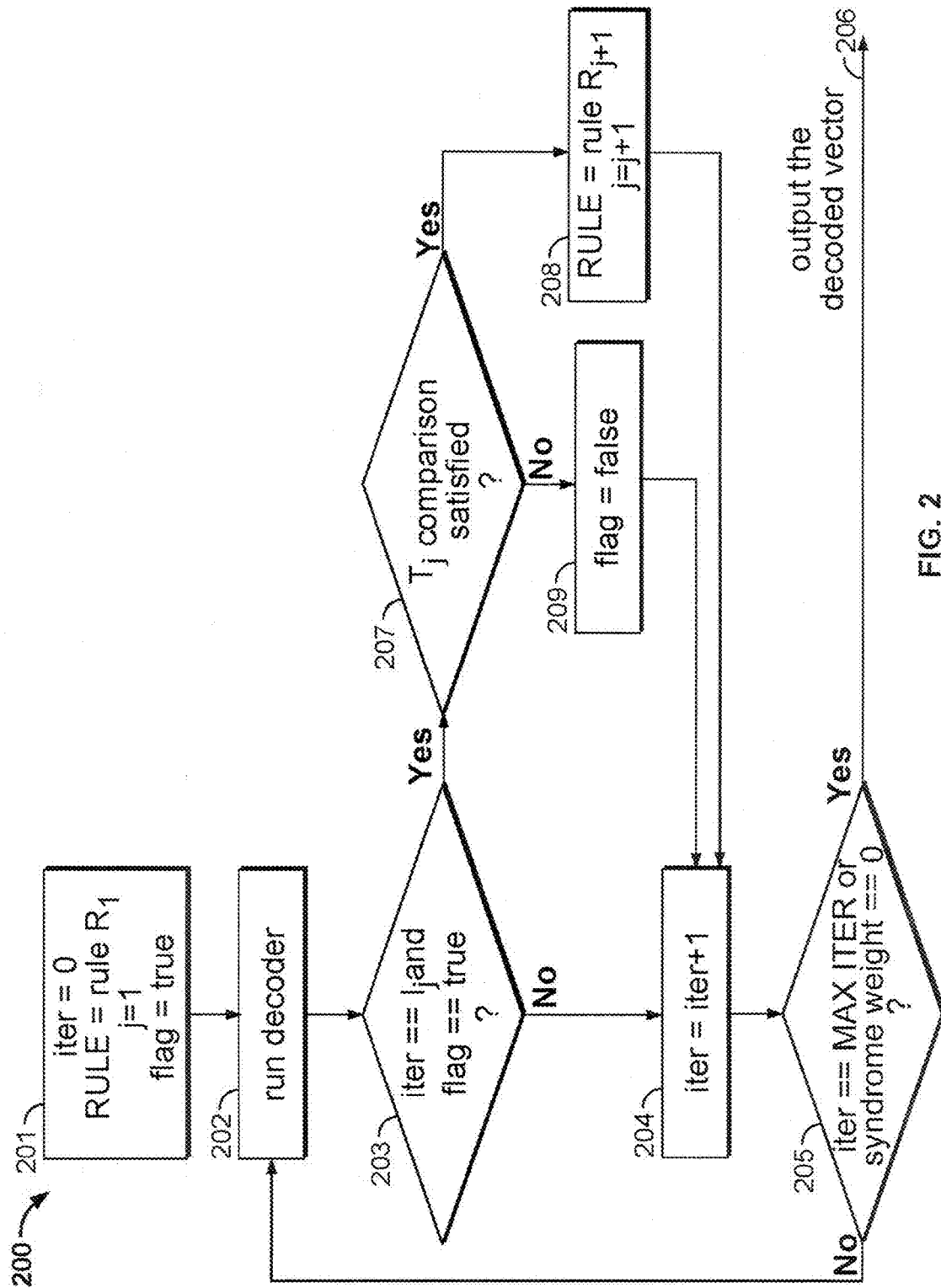
FIG. 2 shows a flow diagram of an implementation of the subject matter of this disclosure in which decoding rules are switched according to thresholds.

FIG. 2 is a flow diagram of an implementation 200 in which the decoding rules are switched according to thresholds. The thresholds can have been derived using the technique shown in FIG. 1, or any other suitable technique.

At 201, decoding begins with rule $R_1$. A variable iter representing the number of the current iteration is set to '0', a counter variable j is set to '1', and a flag variable flag is set to 'true'. An iteration of the decoder is run at 202. At 203, it is determined whether iter is equal to the iteration number $I_j$, and flag is still 'true'. If not (meaning either or both conditions are not true—i.e., iter is not equal to the iteration number $I_j$, or flag is 'false', or both), then at 204, iter is incremented by '1' and at 205 it is determined whether iter has reached the maximum allowable number of iterations (MAX_ITER) or the syndrome weight is '0'. If so (meaning either condition is true), then the decoded vector is output at 206. If at 205 iter has not reached the maximum allowable number of iterations (MAX_ITER) and the syndrome weight is not '0', then the decoder is run again at 202.

If at 203 iter is equal to the iteration number $I_j$, and flag is 'true', then at 207 it is determined whether the threshold test relative to $T_j$ is met (e.g., the test could be whether the syndrome weight is greater than or equal to the threshold $T_j$, or, as noted above, could be a test involving the number of bit flips, or a combination of syndrome weight and bit flips). If so, then at 208 j is incremented and the decoding rule in use is changed from the current rule $R_j$ to the next-most-optimal or next-less-speedy rule $R_{j+1}$. Otherwise, if the threshold test relative to $T_j$ is not met (e.g., the syndrome weight is less than the threshold $T_j$), at 209 the value of flag is changed to 'false'. Either way, flow proceeds to 204 where iter is incremented by '1'.

Thus, as long as the current threshold $T_j$ is met, the flow will follow the path through 208, continually changing to more optimal rules. But once the then-current threshold $T_j$ is not met, flag will be 'false' and the decoder will simply iterate at the then-current rule until either MAX_ITER iterations have executed, or the syndrome weight reaches '0'.

Figure 3:
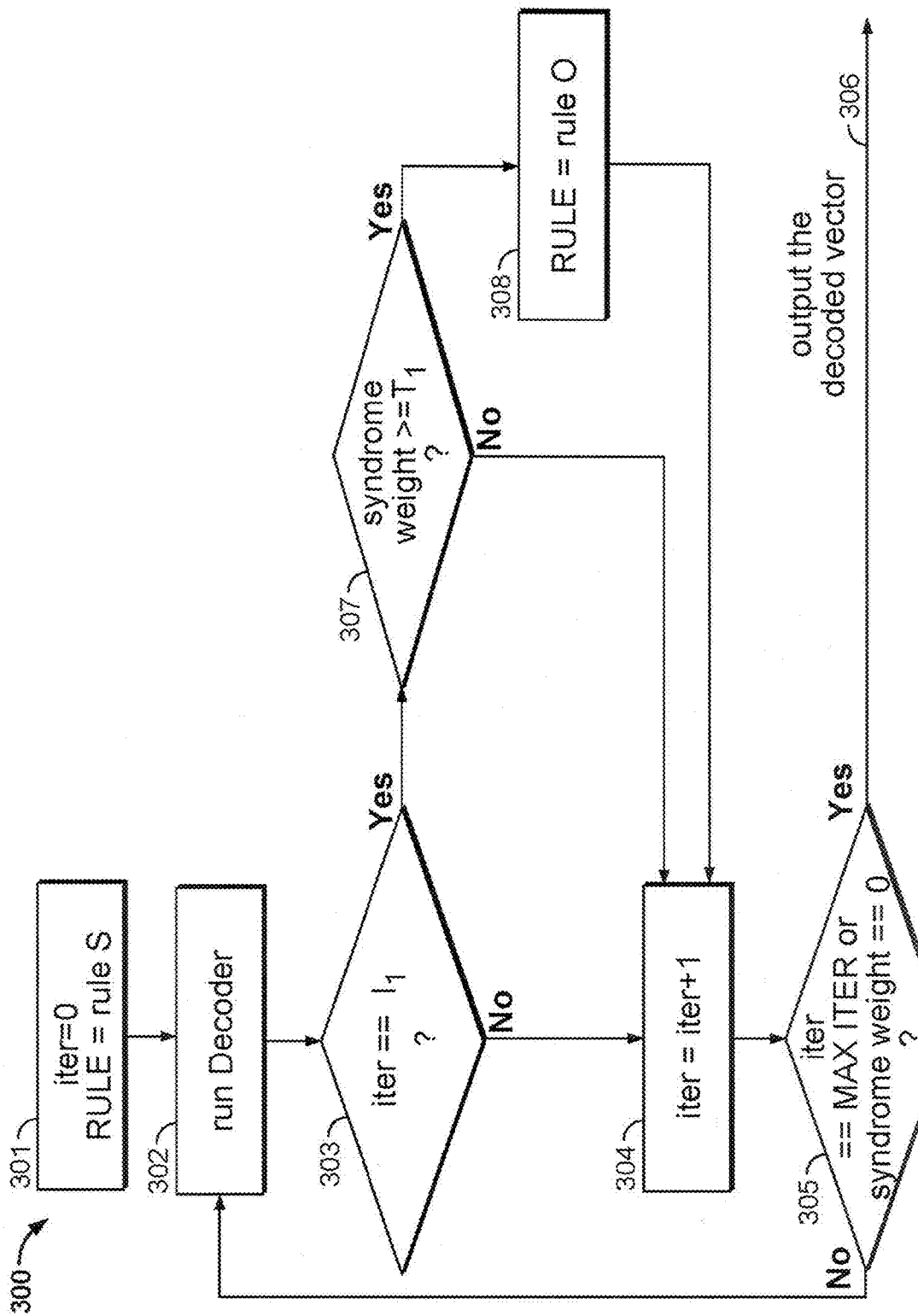
FIG. 3 is a flow diagram another implementation of the subject matter of this disclosure in which decoding rules are switched according to one threshold.

FIG. 3 shows a simpler example 300 where d=2. In this example, there are only two rules $R_1$=Rule S and $R_2$=Rule O, and the threshold test is solely whether the syndrome weight is greater than or equal to the threshold $T_j$.

At 301, decoding begins with rule $R_1$=Rule S. A variable iter representing the number of the current iteration, is set to '0'. An iteration of the decoder is run at 302. At 303, it is determined whether iter is equal to the iteration number $I_1$. If not, then at 304, iter is incremented by '1' and at 305 it is determined whether iter has reached the maximum allowable number of iterations (MAX_ITER) or the syndrome weight is '0'. If so (meaning either condition is true), then the decoded vector is output at 306. If at 305 iter has not reached the maximum allowable number of iterations (MAX_ITER) and the syndrome weight is not '0', then the decoder is run again at 302 with the decoding rule that is currently in use.

If at 303 iter is equal to the iteration number $I_1$, then at 307 it is determined whether the syndrome weight is greater than or equal to the threshold $T_1$, meaning errors cannot be corrected with Rule S. If so, then at 308 the decoding rule in use is changed from the current rule $R_1$=Rule S to the optimal rule $R_2$=Rule O and flow proceeds to 304. Otherwise, if the threshold test is not met (i.e., the syndrome weight is less than the threshold $T_1$), flow proceeds to 304 without any rule change. Either way, at 304 iter is incremented by '1'.

Once the syndrome weight is above the threshold $T_1$, the flow with follow the path through 308, and the rule will change from Rule S to the optimal Rule O. Once the rule has changed to Rule O, it will not change back to Rule S. Either way, the decoder will iterate at the then-current rule until either MAX_ITER iterations have executed, or the syndrome weight reaches '0'.

Figure 4:
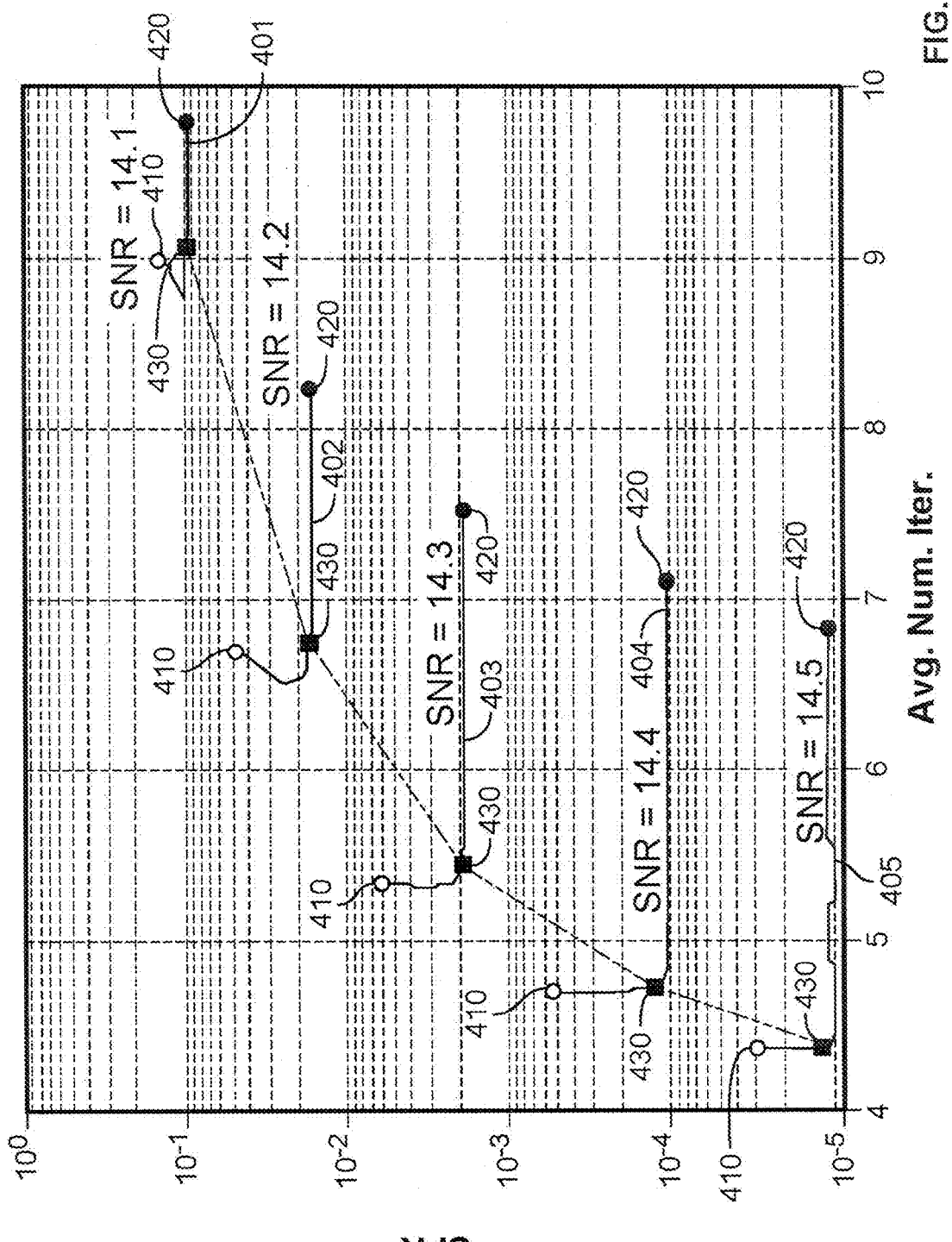
FIG. 4 shows the results of simulated operation of implementations of the subject matter of this disclosure.

FIG. 4 shows the results of simulated operation of implementations of the subject matter of this disclosure on a large number of codewords. Each curve 401, 402, 403, 404, 405 shows the sector failure rate (SFR) as a function of the average number of iterations, at a different selected signal-to-noise ratio (the target signal-to-noise ratio, or SNR, may be an adjustable parameter of the decoder).

The open circle 410 at the left-hand end of each curve 401-405 represents the result achieved by the rule described above as Rule S, while the closed circle 420 at the right-hand end of each curve 401-405 represents the result achieved by the rule described above as Rule O. The square 430 on each curve represents the result achieved by dynamically varying the rules in accordance with embodiments of the subject matter of this disclosure. As can be seen, for each selected SNR, the performance achieved by dynamically varying the rules in accordance with embodiments of the subject matter of this disclosure is similar to that of the more-optimal Rule O, but a smaller average number of iterations is required to achieve that result. Indeed, the average number of iterations required is closer to the average number of iterations required when using the less-optimal Rule S.

Figure 5:
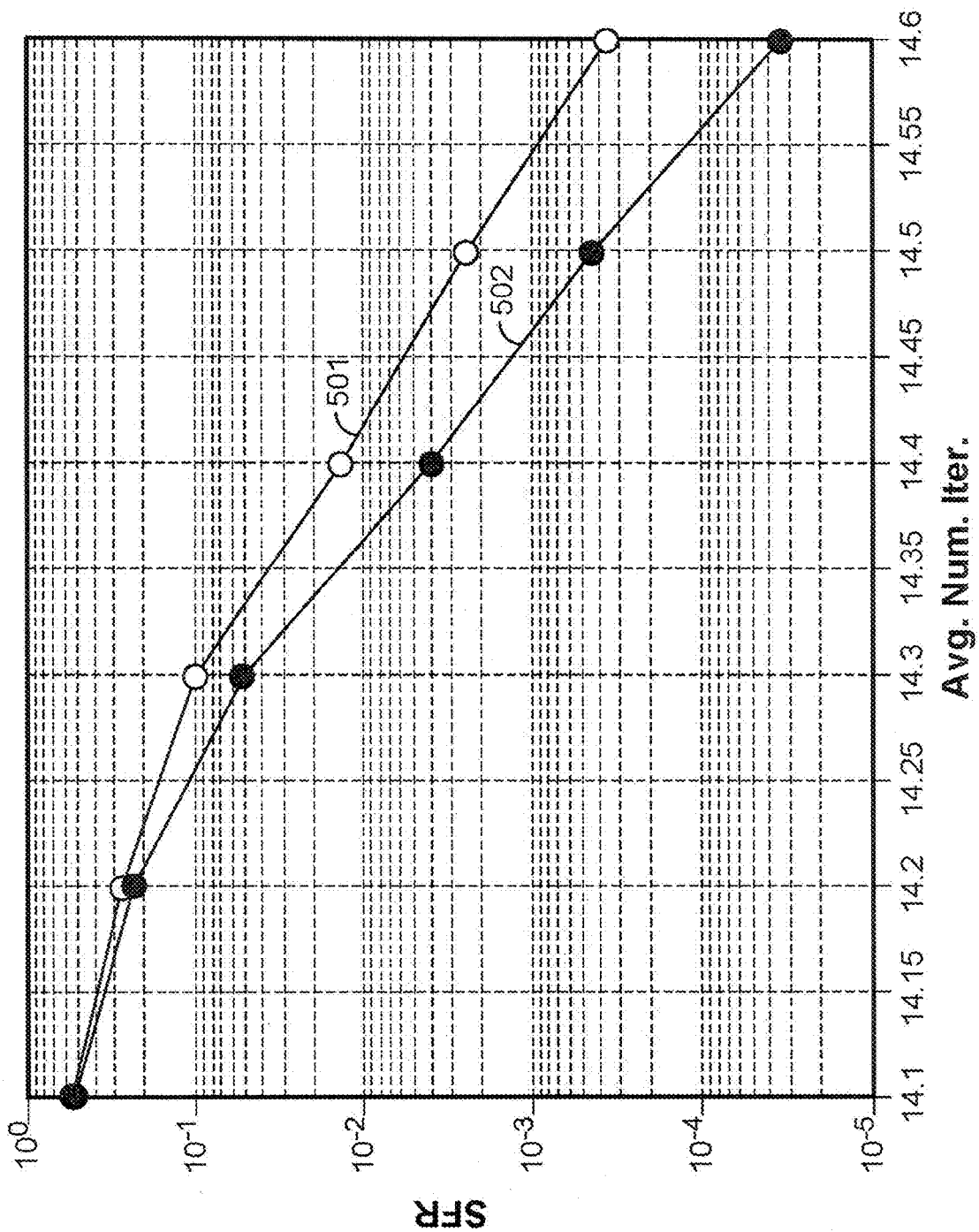
FIG. 5 shows further results of simulated operation of implementations of the subject matter of this disclosure.

In another example, FIG. 5 shows the results of simulated operation of implementations of the subject matter of this disclosure when using an "iteration-on-demand" system in which received codewords are buffered, and the number of iterations for a particular codeword is increased if the previous codeword is decoded faster than expected. In this case, the upper curve 501 shows the performance of a previously-known decoder using the iteration-on-demand feature, while the lower curve 502 (with a lower failure rate than that represented by curve 501) shows the performance of a decoder implementing the subject matter of this disclosure using the iteration-on-demand feature.

Figure 6:
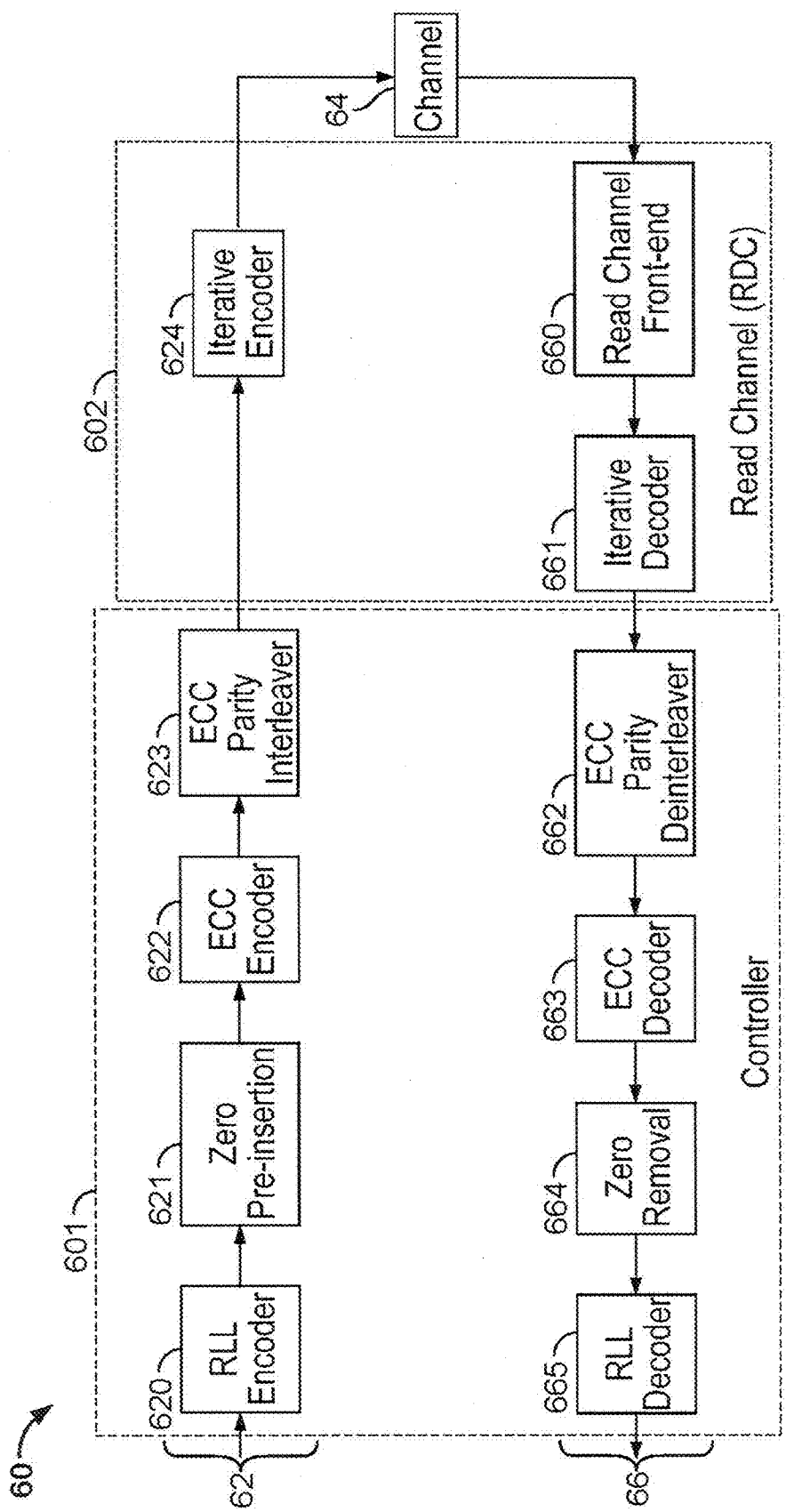
FIG. 6 shows an example of a data channel in which the subject matter of this disclosure can be implemented.

A data channel 60, which is just one example of a data channel in which the subject matter of this disclosure can be implemented, is shown in FIG. 6. This channel may be data storage channel in, e.g., a hard disk drive or solid-state drive, or may be a data transmission channel.

Channel 60 includes an encoder write/transmit path 62, a channel medium 64 and a decoder read/receive path 66, which may be referred to as encoder and decoder paths. Data is encoded via the encoder path 62, stored on or transmitted through the channel medium 64, and read or received and decoded via the decoder path 66.

The encoder path 62 may include encoder stage 620, zero pre-insertion stage 621, error-correcting code (ECC) encoder 622, an ECC parity interleaver 623 and an iterative encoder 624 (e.g., an LDPC encoder). Encoder stage 620 may be a run-length-limited encoder, which prevents long runs without transitions, and can enforce some other constraints, such as direct current (DC) limited constraints. Parity pre-insertion or zero pre-insertion stage 621 divides the data stream into concatenated segments, such as data1 and data2, respectively, by inserting dummy zeroes between them. In some implementations, the stages through the ECC parity interleaver 623 may be located in a controller 601 (e.g., a drive controller when the channel is a data storage channel), while iterative encoder 624 may be located in the physical channel interface 602 itself.

The ECC encoder 622 may be an encoder operating under any suitable error correction encoding scheme, such as, e.g., systematic Reed-Solomon (RS) Code encoding. ECC encoder 622 may be followed by the ECC parity interleaver 623, which operates to interleave parity bits within the ECC-encoded data, as is known.

The decoder path 66 includes a read channel analog front end 660, an iterative decoder 661 (e.g., an LDPC decoder such as, but not limited to, a bit-flipping decoder), an ECC parity deinterleaver 662, an ECC decoder 663, a zero-removal stage 664 and a decoder stage 665 which may be a run-length-limited decoder. Analog front end 660 and iterative decoder 661 may be located in the physical channel interface 602 itself with the remaining decoder stages being in the drive controller 601.

Read channel analog front end 660 may include an analog-to-digital converter, and a digital filter, such as a finite impulse response (FIR) filter.

As previously noted, the systems and methods described above can be used in a data storage or communications channel. The decoding rules can be dynamically changed in the manner described, to adjust to actual conditions, under the control, e.g., of controller 601.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A decoding method for use in circuitry of a data read or receiving channel, the method comprising:
   decoding data iteratively, using logic implemented in the circuitry, according to a first rule;
   at a selected iteration, measuring at least one performance criterion of the decoding of data in the data read or receiving channel according to the first rule;
   at the selected iteration, performing, using the logic implemented in the circuitry, a comparison of the at least one performance criterion to a threshold;
   when the comparison yields a first result relative to the threshold, continuing decoding, using the logic implemented in the circuitry, according to the first rule;
   when the comparison yields a second result relative to the threshold, changing to a further rule that converges more slowly and consumes more power than the first rule and continuing decoding, using the logic implemented in the circuitry, according to the further rule; and
   repeating, according to the logic implemented in the circuitry:
      the decoding of data according to the first rule,
      the measuring the at least one performance criterion at the selected iteration,
      the performing the comparison at the selected iteration, and
      the continuing of decoding according to the first rule or the continuing of decoding according to the further rule, until the comparison yields a predetermined result; wherein:
   according to the logic implemented in the circuitry, once the comparison results in decoding according to the further rule, the repeating is continued, but the logic implemented in the circuitry prevents any subsequent iteration from returning to the first rule regardless of any comparison result in any subsequent iteration.

2. The decoding method of claim 1 wherein the repeating is stopped after a predetermined maximum number of iterations.

3. The decoding method of claim 1 wherein:
   there is only one further rule; and
   once the comparison results in decoding according to the one further rule, the repeating continues but decoding is performed according to the one further rule during each iteration.

4. The decoding method of claim 1 wherein:
   the further rule comprises a plurality of respective further rules of varying speeds of convergence and a plurality of respective thresholds;
   during any selected iteration, the comparison is performed based on a respective threshold related to the respective rule according to which decoding is performed during that selected iteration; and
   once the comparison results in decoding according to one of the further rules having a certain power consumption and speed of convergence, the repeating continues, but the logic implemented in the circuitry prevents any subsequent iteration from returning to the first rule or to any other ones of the further rules that have already been used regardless of any comparison result in any subsequent iteration.

5. The method of claim 4 wherein the plurality of respective thresholds is one less in number than the plurality of rules.

6. The method of claim 4 wherein for any respective rule, the respective threshold related to that respective rule is determined based on performance statistics for that respective rule.

7. The method of claim 6 wherein the performance statistics are syndrome weights.

8. The method of claim 6 wherein the performance statistics are bit flips.

9. The method of claim 1 wherein the threshold is determined based on performance statistics.

10. The method of claim 9 wherein the performance statistics are syndrome weights.

11. The method of claim 9 wherein the performance statistics are bit flips.

12. Apparatus for decoding received encoded data, the apparatus comprising:
    iterative decoding circuitry that operates selectably according to at least a first rule and a further rule;
    circuitry that, at a selected iteration, measures at least one performance criterion of the decoding circuitry of data according to the first rule; and
    circuitry that, at the selected iteration, performs a comparison of the at least one performance criterion to a threshold; wherein:
    when the comparison yields a first result relative to the threshold, the decoding circuitry continues to decode according to the first rule;
    when the comparison yields a second result relative to the threshold, the decoding circuitry changes to a further rule that converges more slowly and consumes more power than the first rule and continues to decode according to the further rule;

the decoding circuitry, the circuitry that measures at least one performance criterion at the selected iteration, and the circuitry that performs a comparison at the selected iteration, operate iteratively until the comparison yields a predetermined result; and once the comparison results in the decoding circuitry changing to the further rule, the decoding circuitry, the circuitry that measures at least one performance criterion at the selected iteration, and the circuitry that performs a comparison at the selected iteration, continue to operate iteratively; the apparatus further comprising:

logic configured to prevent the decoding circuitry, after changing to the further rule, from returning to the first rule during any subsequent iteration regardless of any comparison result in any subsequent iteration.

13. The apparatus of claim 12 wherein iterative operation is stopped after a predetermined maximum number of iterations.

14. The apparatus of claim 12 wherein:

there is only one further rule; and once the comparison results in the decoding circuitry changing to the one further rule, iterative operation continues but the decoding circuitry operates according to the one further rule during all iterations.

15. The apparatus of claim 12 wherein:

the further rule comprises a plurality of respective further rules of varying power consumption and speeds of convergence and a plurality of respective thresholds;

during any selected iteration, the circuitry that performs the comparison performs the comparison based on a respective threshold related to the respective rule according to which the decoding circuitry operates during that one iteration;

once the comparison results in decoding circuitry changing to one of the further rules having a certain power consumption and speed of convergence, iterative operation continues; and during all subsequent iterations, the logic configured to prevent the decoding circuitry, after changing to the further rule, from returning to the first rule during any subsequent iteration regardless of any comparison result in any subsequent iteration, is further configured to prevent the decoding circuitry from returning to any other ones of the further rules that have already been used, regardless of any comparison result in any subsequent iteration.

16. The apparatus of claim 15 wherein the plurality of thresholds is one less in number to the plurality of rules.

17. The apparatus of claim 15 wherein for any respective rule, the respective threshold related to that respective rule is determined based on performance statistics for that respective rule.

18. The apparatus of claim 17 wherein the performance statistics are syndrome weights.

19. The apparatus of claim 17 wherein the performance statistics are bit flips.

20. The apparatus of claim 12 wherein the threshold is determined based on performance statistics.

21. The apparatus of claim 20 wherein the performance statistics are syndrome weights.

22. The apparatus of claim 20 wherein the performance statistics are bit flips.

* * * * *